(12) United States Patent
Park et al.

(10) Patent No.: US 8,702,262 B2
(45) Date of Patent: Apr. 22, 2014

(54) LIGHT SOURCE MODULE AND DISPLAY APPARATUS HAVING THE SAME

(75) Inventors: Jin-Hee Park, Cheonan-si (KR);
Yong-Woo Lee, Suwon-si (KR);
Joo-Young Kim, Asan-si (KR);
Seong-Sik Choi, Seoul (KR);
Byoung-Dae Ye, Yongin-si (KR)

(73) Assignee: Samsung Display Co., Ltd. (KR)

( * ) Notice: Subject to any disclaimer, the term of this patent is extended or adjusted under 35 U.S.C. 154(b) by 797 days.

(21) Appl. No.: 12/417,948

(22) Filed: Apr. 3, 2009

(65) Prior Publication Data

US 2010/0073914 A1    Mar. 25, 2010

(30) Foreign Application Priority Data

Sep. 22, 2008    (KR) .................. 10-2008-0092731

(51) Int. Cl.
*G09F 13/04*    (2006.01)
*F21V 7/04*    (2006.01)

(52) U.S. Cl.
USPC ........................ 362/97.2; 362/630; 362/631

(58) Field of Classification Search
USPC ........................................ 362/97.2, 630–631
See application file for complete search history.

(56) References Cited

U.S. PATENT DOCUMENTS

| | | | |
|---|---|---|---|
| 6,411,353 B1 * | 6/2002 | Yarita et al. ........................ 349/59 |
| 6,439,731 B1 * | 8/2002 | Johnson et al. .................. 362/29 |
| 7,417,859 B2 * | 8/2008 | Bae et al. ........................ 361/710 |
| 7,434,978 B2 * | 10/2008 | Chou ............................. 362/631 |
| 7,436,000 B2 * | 10/2008 | Kim et al. ........................ 257/98 |
| 7,832,884 B2 * | 11/2010 | Ryu ................................. 362/29 |
| 2005/0088092 A1 * | 4/2005 | Kim et al. ...................... 313/582 |
| 2005/0185113 A1 * | 8/2005 | Weindorf et al. ............... 349/71 |
| 2005/0243540 A1 * | 11/2005 | Kim ................................ 362/97 |
| 2006/0038510 A1 * | 2/2006 | Lee et al. ...................... 315/291 |
| 2007/0021007 A1 * | 1/2007 | Park ............................... 439/610 |
| 2007/0076433 A1 * | 4/2007 | Kinoshita et al. ............. 362/615 |
| 2007/0102720 A1 * | 5/2007 | Park ................................ 257/98 |
| 2007/0127208 A1 * | 6/2007 | Shin ............................... 361/694 |
| 2007/0139575 A1 | 6/2007 | Wang |

FOREIGN PATENT DOCUMENTS

| | | |
|---|---|---|
| JP | 2001-133756 | 5/2001 |
| JP | 2007-323857 | 12/2007 |

* cited by examiner

*Primary Examiner* — David J Makiya
(74) *Attorney, Agent, or Firm* — Innovation Counsel LLP

(57) ABSTRACT

The light sourcing module of a backlit LCD display apparatus includes a light sources and power sources supporting substrate. The supporting substrate supports plural light sources on a top major surface thereof and at least one heat generating and power supplying circuit element that protrudes from a bottom major surface of the supporting substrate. The supporting substrate integrally includes wiring that couples driving power output by power supplying circuit element to the plural light sources. A rear receiving frame includes an integral heat-sinking and dissipating recess or groove that is positioned and dimensioned to receive the power supplying circuit element when the supporting substrate is received by the rear receiving frame. The integral heat-sinking and dissipating recess or groove removes heat from the heat generating and power supplying circuit element so that such heat does not adversely affect performance of the light sources.

22 Claims, 8 Drawing Sheets

LIGHT SOURCE MODULE AND DISPLAY APPARATUS HAVING THE SAME

PRIORITY STATEMENT

This application claims priority under 35 U.S.C. §119 to Korean Patent Application No. 2008-92731, filed on Sep. 22, 2008 in the Korean Intellectual Property Office (KIPO), the contents of which application are herein incorporated by reference in their entirety.

BACKGROUND

1. Field of Invention

The present disclosure of invention relates to a light sourcing module and a display apparatus having the light sourcing module. More particularly, the present disclosure relates to a light sourcing module having a plurality of point-type light sources, and a display apparatus having the light sourcing module.

2. Description of Related Technology

Generally, liquid crystal displays (LCDs) are widely used because the LCDs have lower power consumption, smaller volume and lighter weight than conventional cathode ray tubes (CRTs). An LCD apparatus is a light shuttering type of display apparatus, and thus needs an external light source to provide light to the LCD apparatus for selective shuttering thereof by the LCD apparatus.

Cold cathode fluorescent lamps (CCFLs) are mainly used as the light sources of conventional LCDs. Use of a next generation light source such as light-emitting diodes (LEDs) has recently been on the rise.

When LEDs are used in a direct-illumination backlight assembly having a light source disposed directly under a rear surface of a display panel, the LEDs are typically mounted on a printed circuit board (PCB) on which a wiring pattern is formed. The LEDs receive driving power from an external electrical power supply that is mounted on a separate substrate and coupled to the light sources supporting substrate through a discrete interconnect cable.

LEDs can have good color reproducibility, fast response time and low power consumption. But they suffer from poor tolerance to overheating (that is, they have low heat resistance). Thus, heat should be efficiently radiated away from an operating LEDs supporting board so as to maintain the temperature of the LEDs at or below a predetermined maximum operating temperature.

The heat generated from a PCB populated by many LEDs may be very high. For example, if the driving circuit elements that drive the LEDs were to be mounted on the same PCB as the LEDs and the heat generated from such adjacent driving circuit elements is not efficiently radiated away, the LEDs may suffer from a low light-emitting efficiency and performance of the LCD apparatus may thus be adversely affected by the heat and the low light-emitting efficiency of the LEDs.

SUMMARY

The present disclosure of invention provides a light sourcing module having good heat-sinking and radiating away efficiencies.

In an exemplary light sourcing module according to the present disclosure, the light sourcing module includes a light sources and power supplies supporting substrate and a receiving frame. The light sources supporting substrate includes one or more patterned conductor planes (e.g., multi-layered conducting planes such as in a double-sided wiring substrate). The light sources and power supplies supporting substrate is made of precision machineable and/or patternable layers (e.g., electrically insulative and electrically conductive layers) with usage appropriate thermal expansion coefficients and can be positioned in accordance with predefined mass production tolerances relatively precisely in relation to an overlying optical device (e.g., LCD panel). The light sources supporting and power supplies supporting substrate has upper and lower major surfaces that are spaced apart from and face away from one another. A plurality of point-type light sources (e.g., LEDs) are distributed or otherwise disposed across the upper major surface of the light sources supporting substrate so as to face an overlying optical member (e.g., LCD panel) and project light towards that optical member. A first power supplying unit having a respective first driving circuit element is disposed on and protrudes from the lower major surface of the supporting substrate and is electrically coupled to the point-type light sources that are disposed on the upper major surface so as to thereby supply driving power to the light sources. The receiving frame mechanically interfaces with the lower major surface of the supporting substrate. The receiving frame includes a bottom plate having a first heat-sinking groove or recess integrally formed therein, where the groove or recess is dimensioned and positioned to receive the first driving circuit element and to make good thermal contact with the first driving circuit element and to thereby draw heat energy away from the first driving circuit element. The receiving frame is also configured to receive and support the rest of the light sources supporting substrate as well.

The first heat-sinking groove or recess may include a base surface corresponding to where a protruding upper portion of the first driving element may make a thermally conductive contact the recess base surface, and a side surface extended from the lower surface and connected to the base surface. The light sourcing module may further include a pliable heat-transfer member interposed between and making contact with the first driving element and with an inner surface of the first heat-sinking groove. The heat-transfer member may include a silicone grease and/or a pliable silicone pad. The first heat-sinking groove or recess may have heat radiating fins attached to one or more external surfaces thereof.

The power supply unit may further include a second driving circuit element disposed on the light sources supporting substrate (e.g., a double-sided wiring substrate) where the second driving circuit element converts basic input power transmitted from outside into an applied form of electrical power. The first driving circuit element may receive the applied power and output driving power to the point-type light sources of the supporting substrate. In one embodiment, the first driving circuit element may be disposed near a side edge of the lower major surface of the supporting substrate while the second driving circuit element is disposed near the same side edge but on the upper major surface.

In an example display apparatus according to the present disclosure, the display apparatus includes a display panel module, a light sources and power sources supporting substrate and a rear receiving frame. The display panel module includes a display panel, and a panel driving part applying a panel driving signal to the display panel. The light sources and power sources supporting substrate (e.g., a double-sided wiring substrate) has an upper major surface facing a rear surface of the display panel and a lower major surface facing away from the upper major surface. The light sources supporting substrate has a plurality of point-type light sources disposed on its upper major surface. The light sources supporting substrate further has a first power supply unit disposed on and protruding from its lower major surface and electrically coupled to the point-type light sources on the upper major surface so as to supply driving power to those light sources. The rear receiving frame includes a bottom plate having a heat-sinking groove or recess integrally defined therein and dimensioned and positioned to receive and make good thermal contact with the first driving element. The rear receiving frame also includes a sidewall supporting the display panel and positioning the display panel relative to the rear receiving frame.

The light sources supporting substrate may further include a pliable heat-transfer member interposed between and making good thermal contact with a protruding upper portion of the first driving element and with a base surface of the heat-sinking groove or recess. Heat radiating fins or other concavo-convex portions may be formed on or attached to an outer surface of the heat-sinking groove or recess for dissipating away heat energy absorbed by the heat-sinking groove or recess from the first driving element.

The power supply unit may further include a second driving element disposed elsewhere on the light sources supporting substrate (e.g., double-sided wiring substrate) where the second driving element converts a basic input power transmitted from outside into an applied form of power. The first driving element may receive the applied form of power and use the same for outputting a driving power to the point-type light sources. In one embodiment, the first driving element may include a monolithic integrated circuit and may be disposed near a side edge of the lower major surface while the second driving element also includes a monolithic integrated circuit but is opposingly disposed at or near the same side edge but on and protruding from the upper major surface of the light sources supporting substrate. The display apparatus may further include a side frame, an optical member and a front receiving frame. The side frame may cover the side end at which the second driving element is disposed. The optical member may be supported by the side frame and may be disposed between the display panel and the light source substrate. The front receiving frame may expose a display area of the display panel and receive the rear receiving frame.

The display apparatus may further include a rear case, a front case and a bracket. The rear case may receive the rear receiving frame. The front case may expose the display area, receive the front receiving frame and be combined with the rear case. The bracket may be disposed between the rear receiving frame and the rear case and join the rear receiving frame to the rear case. The rear receiving frame may include a pre-threaded joining or combining portion which protrudes from the bottom plate and allows the rear receiving frame to be combined with the bracket portion of the rear case by means of a thread matching screw that can counter protrude into the protruding combining portion. The portion of the bracket which combines with the combining portion may be spaced apart from the heat-sinking groove or recess so that a heat dissipating hollow area (e.g., having heat absorbing air) is defined between the combining portion and the heat-sinking groove or recess.

According to one aspect of the present disclosure, a heat-sinking and dissipating groove or recess is integrally formed as a continuous part of a rear receiving frame comprised of a heat conducting metal material. The heat-sinking and dissipating groove or recess is dimensioned and positioned so as to receive and thermally couple to a lights driving element which tends to have high heat output. Since the heat-sinking and dissipating groove or recess is integrally formed, there is no need to provide during mass production, a separately attached, additional cooling plate or an additional cooling pins to the lights driving element so that heat may be efficiently dissipated from that element and radiated away from the light sources so as to avoid overheating the LED point-type light sources.

In addition, a power supply unit is integrally formed on the light sources supporting substrate so that separate coupling cables and additional printed circuit boards for supporting the power supply unit and interconnecting its elements may be omitted and associated mass production costs as well as associated manufacturing defect problems may be avoided.

BRIEF DESCRIPTION OF THE DRAWINGS

The above and other features and advantages of the present disclosure will become more apparent by describing in detailed example embodiments with reference to the accompanying drawings in which.

DETAILED DESCRIPTION

Figure 1:
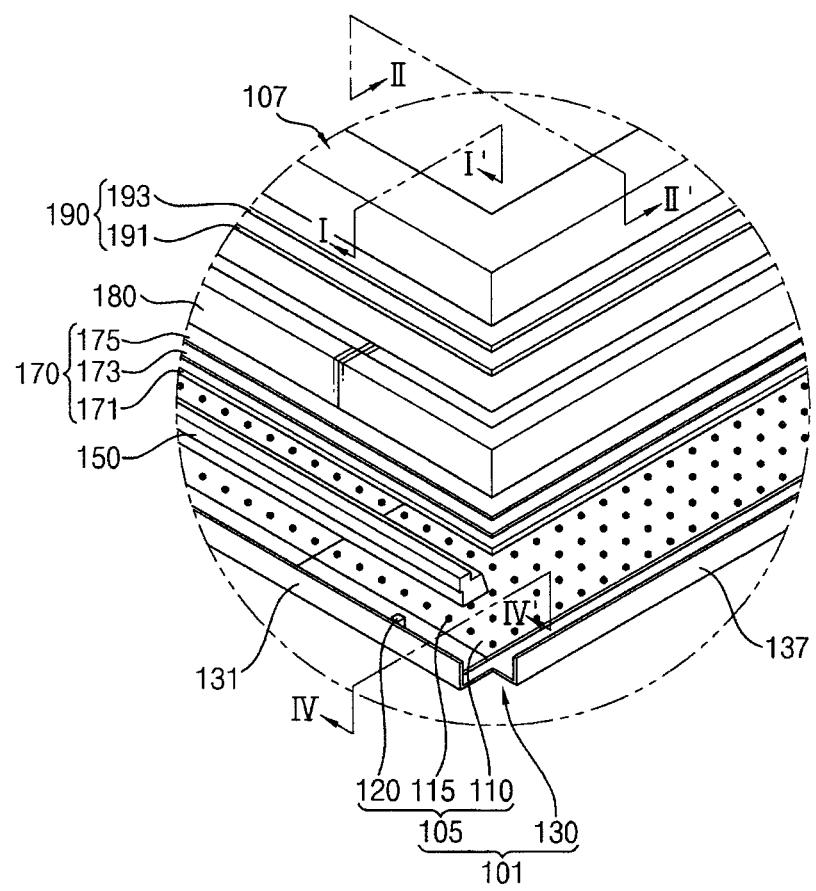
FIG. 1 is an exploded perspective view partially illustrating a display apparatus according to a first example embodiment.

A more detailed description is hereinafter provided with reference to the accompanying drawings, in which example embodiments are shown. The present teachings may, however, be embodied in many different forms and should not be construed as limited to the example embodiments set forth herein. Rather, these example embodiments are provided so that this disclosure will be thorough and complete, and will fully convey the scope of the present teachings to those skilled in the art. In the drawings, the sizes and relative sizes of layers and regions may be exaggerated for clarity.

It will be understood that when an element or layer is referred to as being "on," "connected to" or "coupled to" another element or layer, it can be directly on, connected or coupled to the other element or layer or intervening elements or layers may be present. In contrast, when an element is referred to as being "directly on," "directly connected to" or "directly coupled to" another element or layer, there are no intervening elements or layers present. Like numerals refer to like elements throughout. As used herein, the term "and/or" includes any and all combinations of one or more of the associated listed items.

It will be understood that, although the terms first, second, third, etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the present invention.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular example embodiments only and is not intended to be limiting of the present disclosure. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Example embodiments are described herein with reference to cross-sectional illustrations that are schematic illustrations of idealized example embodiments (and intermediate structures) of the present invention. As such, variations from the shapes of the illustrations as a result, for example, of manufacturing techniques and/or tolerances, are to be expected. Thus, example embodiments of the present invention should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of the present disclosure.

Unless otherwise defined, all terms (including technical and scientific terms) used herein have the same meaning as commonly understood by one of ordinary skill in the art to which this disclosure most closely pertains. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Figure 2:
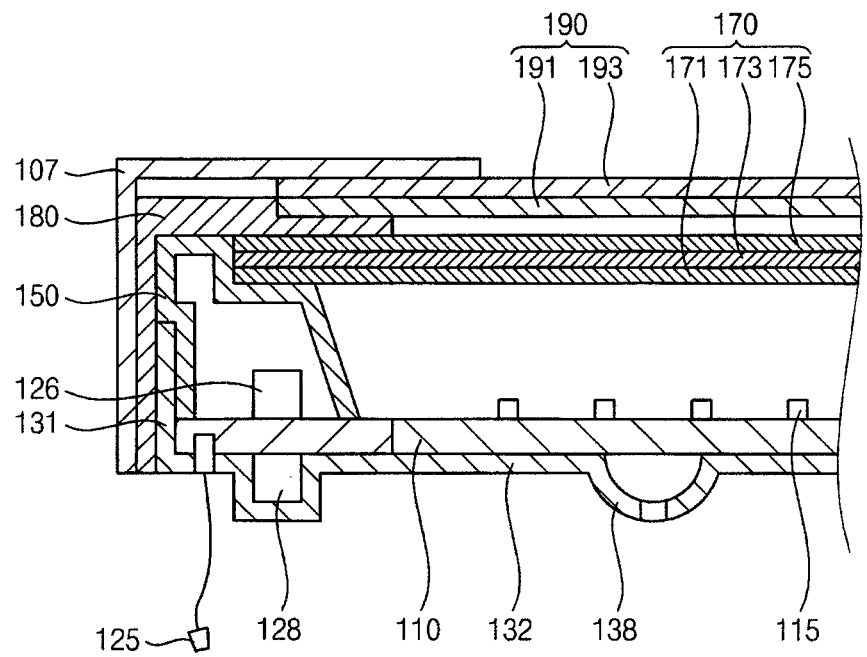
FIG. 2 is a cross-sectional view taken in parallel with line I-I' of FIG. 1.
Figure 3:
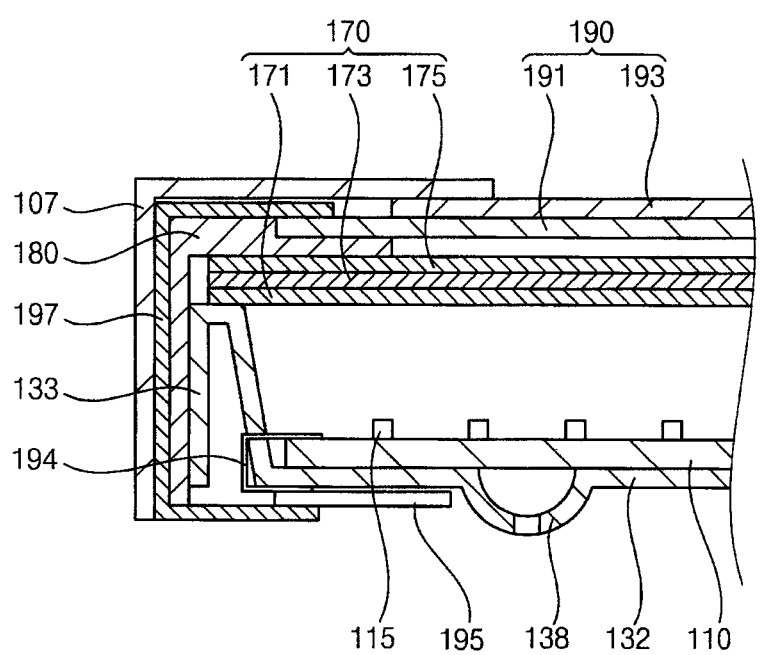
FIG. 3 is a cross-sectional view taken in parallel with line II-II' of FIG. 1.

FIG. 1 is an exploded perspective view partially illustrating a display apparatus according to an example embodiment of the present disclosure. FIG. 2 is a cross-sectional view taken along a line parallel to I-I' of FIG. 1. FIG. 3 is a cross-sectional view taken along a line parallel to II-II' of FIG. 1.

Referring to FIGS. 1, 2 and 3, the display apparatus 100 includes a display panel module (e.g., LCD panel module) and a back lights sourcing module 101.

The display panel module displays an electronically controlled image using light emitted from the backlight sourcing module 101 and using one or more image defining signals transmitted from outside. The display panel module includes a display panel 190 and a panel driving part (e.g., LCD driving circuits on a ribbon-cable connected PCB, shown for example as 195 at the bottom of FIG. 3).

The display panel 190 displays the signal-defined image on a front display area thereof where the front is uppermost in FIG. 1. As mentioned, the displayed image is an electronic shutter based one and thus depends on backlighting emitted from the light sourcing module 101, which latter module 101 is shown lowermost in FIG. 1. The displayed image is also dependent on panel driving signals transmitted from the panel driving part (e.g., LCD driving circuits on a ribbon-cable connected PCB 195, shown in FIG. 3). The display panel includes a lower first substrate 191 (sometimes referred to as the TFT substrate), a spaced apart second substrate 193 (sometimes referred to as the color filters substrate) and a liquid crystal material layer (no reference number) interposed therebetween.

The first substrate 191 may include a plurality of pixel portions arranged as a matrix, where each pixel portion includes a switching element (e.g., a thin film transistor or TFT) and a data line segment for applying a supplied data voltage through the switching element to a pixel-electrode (not shown) of the respective pixel portion.

The second substrate 193 faces the first substrate 191 and is spaced apart from the first substrate 191. The second or top substrate 193 generally has a smaller area than the first substrate 191. Thus, a side end of the first substrate 191 is exposed. The second substrate 193 may include a plurality of differently colored color filters and a common electrode. Electric fields are selectively formed between the pixel-electrodes of the corresponding pixel portions and the common electrode so as to at least partly define the desired image.

More specifically, when electric fields of appropriate strengths and/or orientations are generated between the pixel electrodes and the common electrode, the arrangements of liquid crystal molecules in the liquid crystal layer may be changed accordingly. The liquid crystal molecules have light polarizing characteristics and as a consequence of their arrangements, the transmissivity of the light passing through the liquid crystal layer is changed and the display panel 190 displays the image as a matrix of pixels having respective gray scale shuttering effects on backlights projected from the back of the display panel 190.

The display panel module may further include a flexible connecting printed circuit film 197 which is shown in FIG. 3. In one embodiment, the connecting printed circuit film 197 is bonded to the panel driving part 195 and the side end of the first substrate 191, to thereby electrically connect the panel driving part 195 to the first substrate 191.

The panel driving part 195 outputs panel driving signals to the display panel 190. The panel driving signals may include a data control signal and a gate control signal. The data control signal controls data voltages applied to the pixel-electrodes of the pixels. The gate control signal controls the switching element switching the data voltage to the pixel portion.

Figure 4:
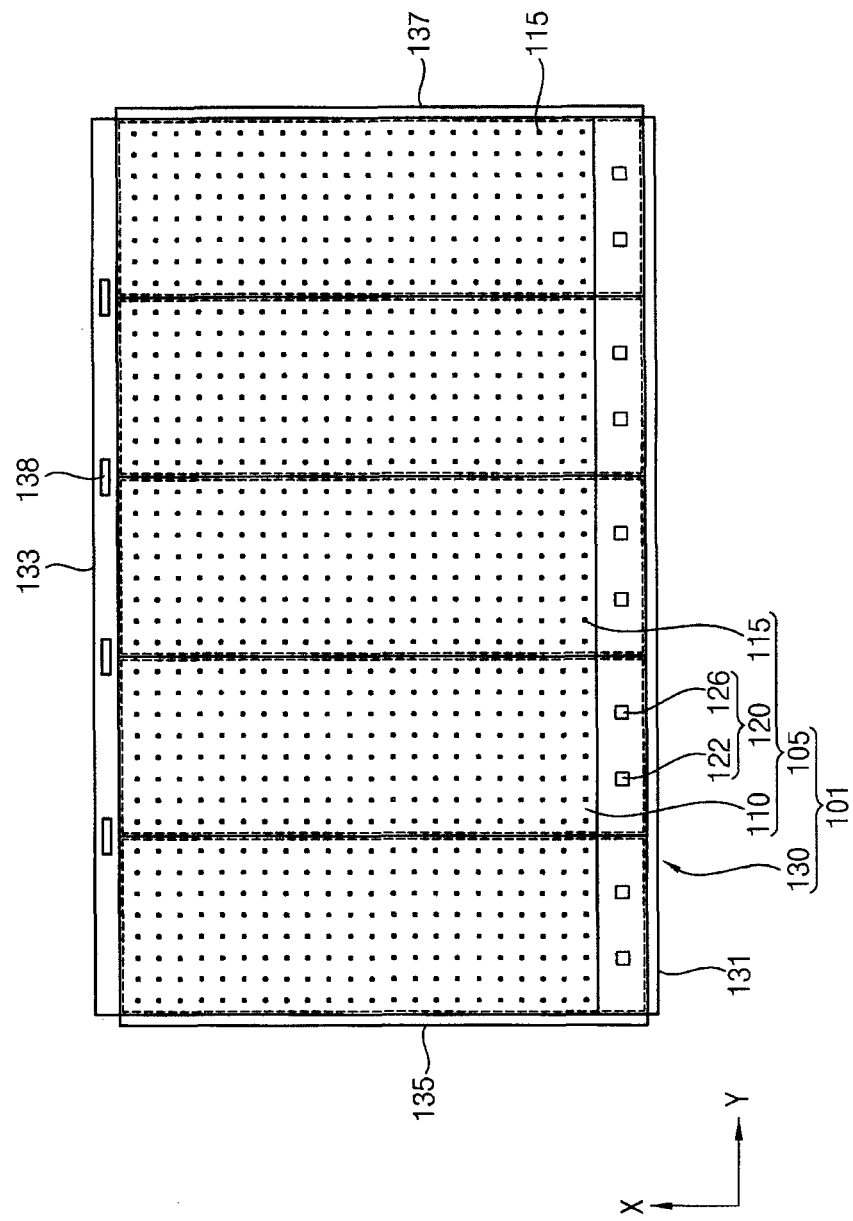
FIG. 4 is a plan view illustrating a light sourcing module having a plurality of light sources supporting substrates received in a rear receiving frame in accordance with FIG. 1.
Figure 5:
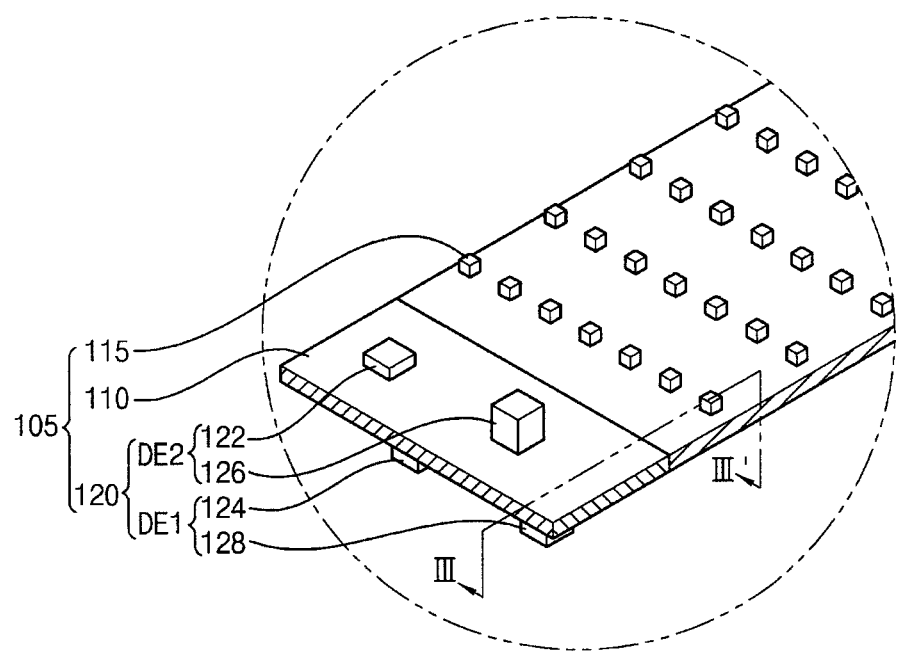
FIG. 5 is a perspective view illustrating one of the plural light sources supporting substrate of FIG. 4.

FIG. 4 is a plan view illustrating a light source module of FIG. 1. FIG. 5 is a perspective view illustrating a light source substrate of FIG. 4.

Referring to FIGS. 4 and 5, the light sourcing module 101 emits the lights which are a basis of displaying the shutter-controlled image, to a rear surface of the display panel 190. The light sourcing module 101 according to the present example embodiment includes a plurality of light source substrates 105 received by and supported by a rear receiving frame 130. In one embodiment, the light source substrates 105 are serially arranged along a Y direction as shown in FIG. 4.

Each light sources supporting substrate 105 of one embodiment includes a double-sided wiring substrate structure 110, a plurality of point-type light sources 115 and a respective power supply unit 120.

The double-sided wiring substrate structure 110 includes upper and lower wiring planes spaced apart from each other and integrated within the light sources supporting substrate 105. The double-sided wiring substrate structure 110 may be constructed as a printed circuit board (PCB) on which layers of wiring patterns are formed. The double-sided wiring substrate structure 110 may include a plurality of insulation layers, where the plural wiring patterns of the double-sided wiring substrate are formed between the insulation layers. The wiring patterns may be formed in both the upper and lower wiring planes and connected to circuit elements by way of vertical vias and the like. Thus, an electronic device such as a condenser, a resistor, an inductor (e.g., transformer) or other current to voltage converter, one or more microchips (e.g., monolithic integrated circuits), LEDs, and so on may be mounted on the upper and lower major surfaces of the light sources supporting substrate 105 and interconnected by means of the upper and lower wiring planes.

The point-type light sources 115 are disposed on the upper major surface of the light sources supporting substrate. In one embodiment, the point-type light sources 115 are spaced apart by predetermined distances to thereby define a matrix for example having columns extending in a first direction X and having rows extending in a second direction Y as shown in FIG. 4. Of course, the arrangement type of the point light sources 115 need not be limited to such a matrix and can be organized according to a variety of other repeating patterns.

Figure 6:
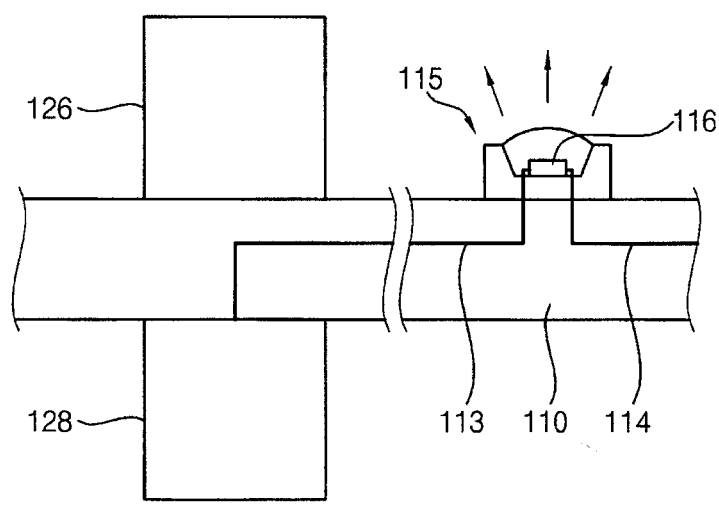
FIG. 6 is a cross-sectional view taken along a line III-III' of FIG. 5.

FIG. 6 is a cross-sectional view taken along a line III-III' of FIG. 5.

Referring to FIG. 6, the point-type light sources 115 may each include a white light-emitting diode (LED) that is configured to act substantially as a point source emitting a white light. Alternatively, the point-type light sources 115 may each be a plurality of LEDs cooperating to act substantially as one point light source 115 where the packaged together LEDs may include a red light-emitting chip 116, a green light-emitting chip and a blue light-emitting chip. A respective current input line 113 and a ground line 114 are electrically connected to each white LED or to each of the red, green and blue light-emitting chips. Thus, in the case of RGB or other primary color sourcing combinations, three or more input lines 113 and perhaps as many as three or more ground lines 114 may be connected to the one point light source unit 115.

Figure 7:
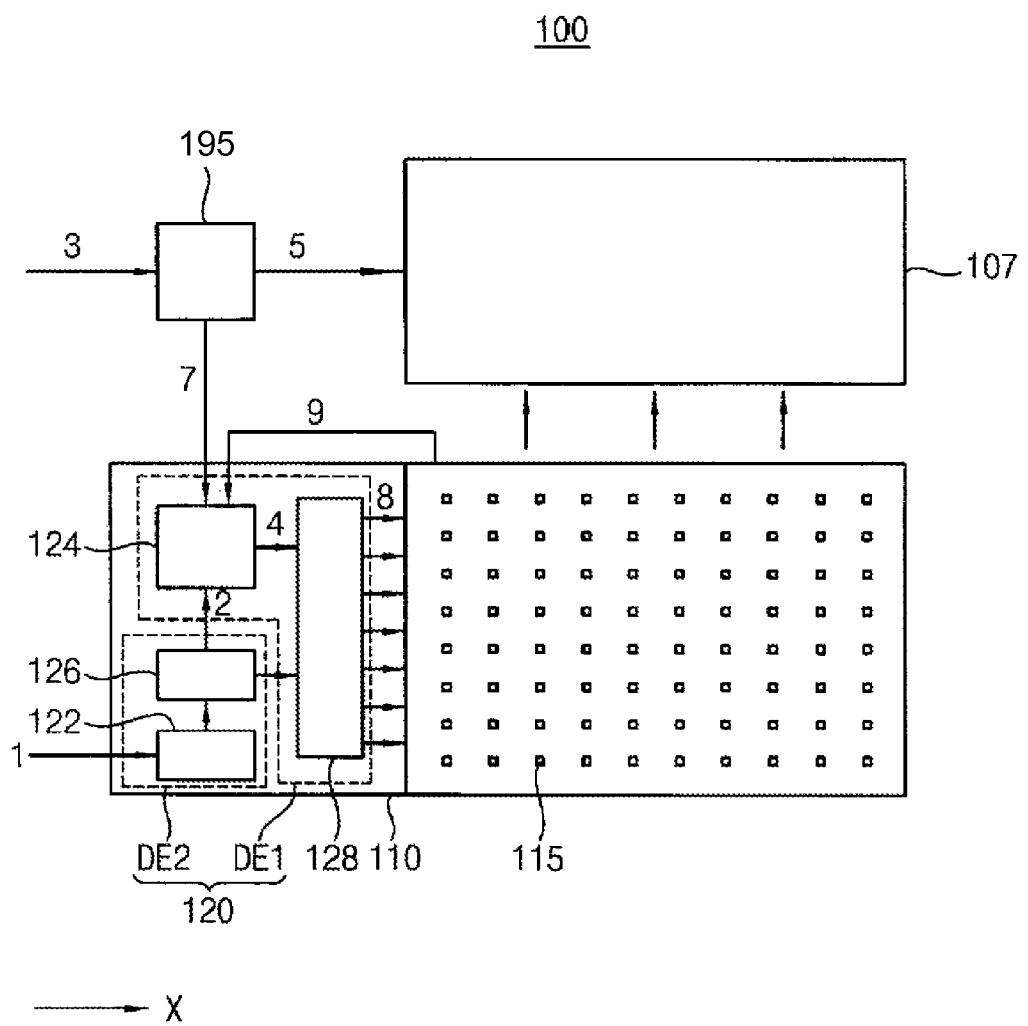
FIG. 7 is a block diagram explaining operations of the display apparatus of FIG. 1.

FIG. 7 is a block diagram explaining the operation of the display apparatus of FIG. 1.

Referring to FIGS. 5 and 7, the power supply unit 120 (which includes subunits DE1 and DE2) converts a basic first form input power 1 (e.g., AC input power) applied from outside into one or more driving power currents 8 for controllably driving the respective point light sources 115. The power supply unit 120 is disposed on the double-sided wiring substrate 110. For example, in the present example embodiment, instead of using a separate power supply substrate connected to the double-sided wiring substrate 110, the circuitry of the power supply unit 120 is integrally formed on the same substrate 105 with the double-sided wiring substrate structure 110 and integrally connected to the double-sided wiring substrate structure 110. As such, manufacturing costs and defects associated with having separate PCBs and interconnect cables may be avoided.

In the present example embodiment, the power supply unit 120 is disposed at or near a side edge of the double-sided wiring substrate 110 along the first direction X. The power supply unit 120 includes first and second driving elements denoted as DE1 and DE2. The power supply unit need not be limited to the exemplary power supply unit 120 as illustrated in FIG. 7 to have discrete major parts 122, 126 and 128. Other embodiments may have more or fewer discrete components.

The first driving element DE1 converts an applied power 2 into the one or more driving power currents 8, and outputs the driving power currents 8 to the point light sources 115. The first driving element DE1 is mounted at or near the side edge of the light sources supporting substrate and protruding from the lower major surface thereof (see for example FIG. 6). The first driving element DE1 may be electrically connected to the point light sources 115 through the upper wiring pattern 113.

The second driving element DE2 converts a basic form of input power 1 (e.g., AC input power) supplied from the outside into the applied power 2, and outputs the applied power 2 to the first driving element DE1. In one embodiment, the second driving element DE2 is disposed at the same side edge of the light sources supporting substrate as is DE1 but protruding from the upper major surface thereof (see for example FIG. 6). Alternatively, the second driving element DE2 may be disposed near the same side end while protruding from the lower major surface.

The second driving element DE2 may include a first converter 122 and a second converter 126.

In one embodiment, the first converter 122 (e.g., AC/DC converter) converts the basic power 1 having an alternating current into the applied power 2 constituted as a DC or direct current power. For example, the first converter 122 includes a 4 rectifier bridge circuit for rectifying the alternating current and it includes a first capacitance for smoothing and thereby forming the direct current. The second converter 126 (e.g., DC/DC switched power converter) transforms the applied power 2 having the direct current and a first voltage level into DC power having a different second voltage level. For example the second converter 126 may include a high frequency switched transformer that lowers the voltage level of the applied power 2.

The first driving element DE1 may include a power controller 124 and a power output part 128.

The power controller 124 outputs a power control signal 4 to the power output part 128. The panel driving part 195 generates the panel driving signal 5 and the light source control signal 7 linked with the panel driving signal 5 based on an image signal 3 transmitted from outside. The power controller 124 outputs the power control signal 4 based on the light source control 7 and a feedback signal 9 transmitted from the point light sources 115. The power control signal 4 is compensated by the feedback signal 9, and the driving power 8 applied to the point light sources 115 is controlled by the feedback signal 9.

The power output part 128 converts the applied power 2 lowered by the second converter 126 into the driving power 8 and outputs the driving power currents 8 to the point light sources 115, in accordance with the power control signal 4. The power output part 128 defines the voltage levels of the applied driving power currents 8, the current levels of the applied driving power currents 8 and the waveforms of the respective driving powers 8, according to the power control signal 4. The specific control for driving the point-type light sources 115 may be for generating uniform backlighting or for providing selective backlight dimming control as may be appropriate for the specific image forming processes being used by the display apparatus.

When the first and second driving elements DE1 and DE2 are constantly driven at maximum levels, a relatively high amount of heat may be generated. For example, the high heat may be generated from the power output part 128 if all output currents 8 are at maximum levels.

The power source substrate 105 is received by the rear receiving frame 130 and is blocked from being directly exposed to outside air by a housing as shall be seen. Accordingly, if the heat generated from the first and second driving elements DE1 and DE2 is not somehow efficiently dissipated to the outside, temperatures may build up and as a result the point light sources 115 may exhibit low light-emitting efficiencies and the display panel 190 may exhibit bad performance.

Figure 8:
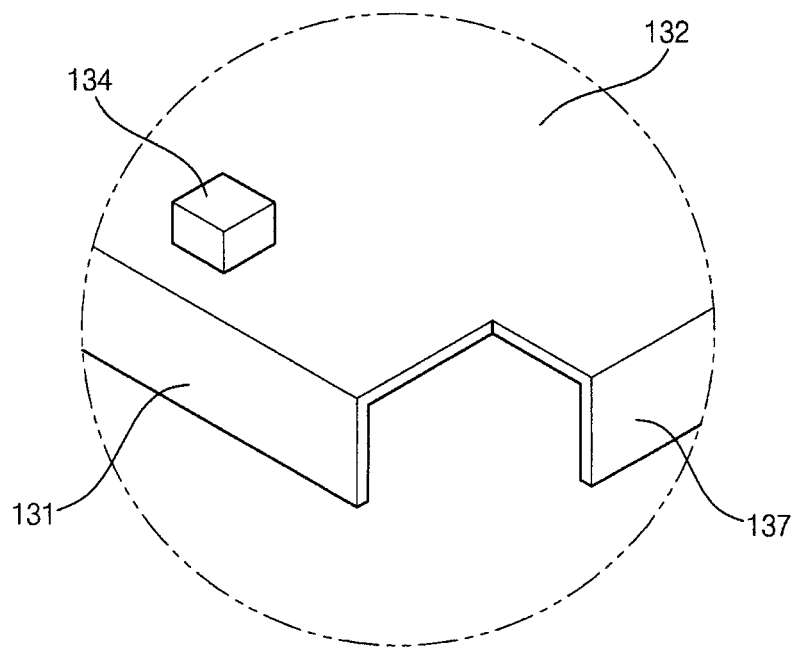
FIG. 8 is a perspective view illustrating a rear surface of a rear receiving frame of FIG. 1 and from which a heat sinking recess protrudes.
Figure 9:
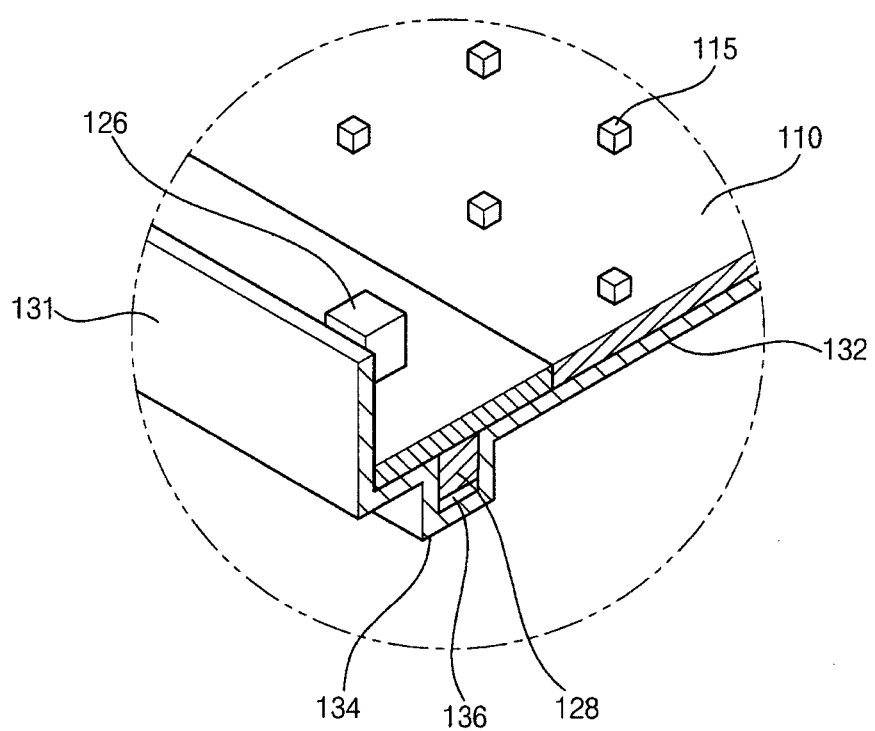
FIG. 9 is a perspective view taken along a line IV-IV' of FIG. 1.

FIG. 8 is a perspective view illustrating a rear surface of a rear receiving frame 130 of FIG. 1. FIG. 9 is a perspective view taken along a line IV-IV' of FIG. 1.

Referring to FIGS. 8 and 9, the rear receiving frame 130 is configured to conformably receive protruding parts of the power source modules 120 of the respective light source substrates 105. The rear receiving frame 130 includes a good heat conducting material such as one or more metals (e.g., copper, aluminum, etc.). The rear receiving frame 130 includes a bottom plate, 132, first, second, third and fourth sidewalls 131, 133, 135 and 137, and one or more recesses such as 134 integrally formed of the good heat conducting material by for example stamp pressing and side wall bending.

The power supply and light sources supporting substrate 105 is disposed on the bottom plate 132. The lower major surface of the power supply and light sources supporting substrate 105 may make direct contact with the bottom plate 132. Heat-sinking and removing and/or radiating recesses or grooves 134 into which the power controller 124 and the power output part 128 are inserted are integrally formed as continuous parts of the bottom plate 132.

The heat-sinking and removing/radiating grooves or recesses 134 (only one shown in FIG. 8) include a base surface protruded downwardly from the lower surface and a side surface connecting the lower surface to the base surface. One or both of the power controller 124 and the power output part 128 may make direct or indirect good thermal contact with the base surface and/or the side surface(s) of the heat-sinking and removing and/or radiating groove 134 so that a substantial amount heat energy may be removed from the power controller 124 and/or the power output part 128 by such thermal contact.

In the present example embodiment, the power source module 101 may further include a pliable heat-conducting member 136, for example, an electrically insulating but heat-conducting and pliable silicone pad or a filling of silicone grease. The heat-conducting member 136 is disposed on the base surface of the heat-removing and radiating groove 134, and makes good thermal contact with the power controller 124 and/or the power output part 128. Heat radiating fins or other concavo-convex portions (not shown) may be formed on an outer surface of the heat-sinking groove 134 to enhance the efficiency of dissipating heat to surrounding air.

Thus, heat generated from one or both of the power controller 124 and the power output part 128 may be easily and well conducted to the outside and radiated or otherwise dissipated away to outside through the heat transfer and heat-sinking and/or dissipating and/or radiating functions of the groove or recess 134. Through experimental verification for one embodiment, it was found that when heat was transferred through and dissipated away with use of the pliable heat-conducting member 136 and the heat-removing and dissipating/radiating groove 134, the average temperature of the first driving element DE1 was lowered by between about 3° and about 5° as compared to when thermal contact to a heat sinking device was not provided.

Such lowering of the temperature by even for example between about 3° and about 5° can be significant to long term device reliability and efficiency of nearby LEDs. Through experimental verification, when the first and second driving elements DE1 and DE2 were disposed on the upper surface of the PCB, and just a heat-conducting pad 136 made contact between the first and second driving elements DE1 and DE2 to an inner surface of the rear receiving frame 130 without using the heat-sinking and radiating groove 134, the temperature of the first driving element DE1 was not effectively lowered.

Alternatively, when the second driving element DE2 is also disposed on the lower major surface of the light sources supporting substrate 110, a heat-sinking and/or radiating groove into which the second driving element DE2 is inserted may be additionally formed on the bottom plate 132 and dimensioned and positioned to conformably receive the second driving element DE2 with optional aid of a conforming silicone grease and/or pliable silicone pad 136. The outer surfaces of the heat-sinking and/or radiating groove(s) are believed to provide sufficient surface areas for convectively dissipating excess heat into surrounding air, which air is then exhausted to the outside through casing vent holes.

Referring to FIGS. 1, 2 and 3 again, combining elements to combine the display apparatus 100 with additional elements may be formed on the rear surface of the bottom plate 132. For example, combining portions 138 may be joined to further elements such as being combined with a bracket by screws where portions 138 are protruded for providing a spacing apart and screw receiving function. If desired, the combining portion 138 may be protruded higher than the heat-sinking/radiating groove 134 from the rear surface of the bottom plate 132. In an alternate embodiment, the combining portion 138 protrudes slightly less and thus provides for a contacting tension to be created between the bracket (240 in FIG. 10 for example) and a minor outer surface portion of the heat-sinking/radiating groove 134.

The panel driving part 195 is disposed on the rear surface of the bottom plate 132, and the connecting printed circuit film 197 electrically connects the panel driving part 195 to the first substrate 191 of the display panel 190. As explained in FIG. 7, the panel driving part 195 may be electrically connected to the power supply unit 120 disposed on the double-sided wiring substrate 110.

In FIG. 3, a cable withdrawing hole may be formed on the bottom plate or the sidewall, so that the panel driving part 195 may be connected to a connector of the double-sided wiring substrate 110 through a connecting cable 197 that bonds to lower substrate 191 of LCD panel 190. Also in FIG. 3 middle frame 180 serves as an alignment part for precisely aligning various components of the assembly to each other. A first sideface of middle frame 180 establishes the lateral position of the LCD panel 190 relative to the sidewall 133 of the rear receiving frame 130. A second part of middle frame 180 establishes the vertical spacing position of the LCD panel 190 relative to optical processing unit 170. In FIG. 2, bracket 150 (which includes a reflective angled plate) establishes the lateral position of the optical processing unit 170 relative to sidewall 131. In FIG. 3, sidewall 133 (which includes a reflective angled plate) establishes the lateral position of the light sources supporting substrate 110 relative to middle frame 180. A metal spring clip 194 or the like is used to fix the lateral position of the light sources supporting substrate 110 on bottom plate 132 of the rear receiving frame 130. In FIG. 2, an end edge of light sources supporting substrate 110 abuts laterally against sidewall 131.

In addition to the above details, and as mentioned above, the power supply unit 120 generating the driving power 8 is integrally formed on the light sources supporting substrate 110. Flexible power cable 125 supplies a basic form of input power (e.g., AC power) to the power supply unit 120. Since the light sources supporting substrate 110 is precisely aligned with the overlying LCD panel by means for example of precisely forming the sidewalls 131, etc. of the rear receiving frame 130 against which sidewalls 131, etc. the LCD panel precisely aligns with aid of an alignment bracket (e.g., middle frame 180), the protruding devices of the power supply unit 120 may also be precisely aligned on the supporting substrate 110 and thus with respect to the rear receiving frame 130 and heat-sinking/radiating features (e.g., 134) provided thereon. Thus, an additional power supply substrate for supporting the devices of the power supply unit 120 may be omitted, a power connector making interconnection between an external such additional power supply substrate and the light sources supporting substrate 110 may be withdrawn, and use of separate, nonintegrated heat sinking devices may be avoided so as to thereby reduce mass production costs and avoid possible production defects that may come with use of discretely combined components rather than integrally co-formed components.

The display apparatus 100 may further include a side frame 150, an optical member 170 and a front receiving frame 107.

The side frame 150 extends along the second direction Y, and covers the side end of the upper surface of the double-sided wiring substrate 110 on which the second driving element DE2 is disposed. A stepped portion is formed on an upper surface of the side frame 150.

The optical member 170 is supported by the stepped portion of the side frame 150, and may be supported by an upper portion of the sidewall of the rear receiving frame 130 facing the side frame 150. The optical member 170 may include a light diffusing plate 171, a light diffusing sheet 173 and a light condensing sheet 175 sequentially integrated.

The front receiving frame 107 exposes the display area of the display panel 190 and receives the rear receiving frame 130. The front receiving frame 107 include an edge portion covering an edge of the display panel 190, and a side portion extending from the edge portion to face and align with the sidewalls 131, 133, 135 and 137 of the rear receiving frame 130.

Figure 10:
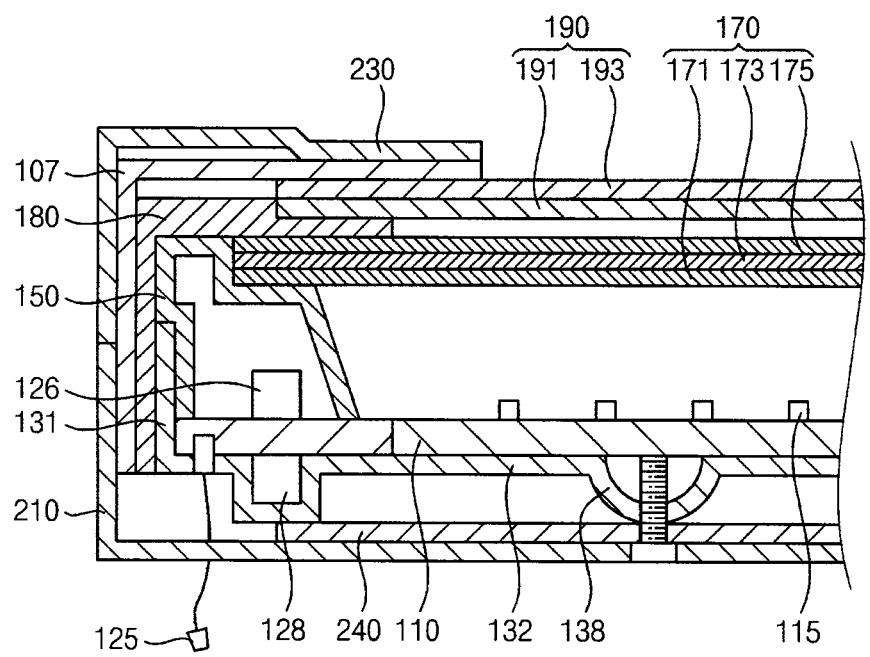
FIG. 10 is a cross-sectional view illustrating a light sourcing module and a display panel module received by and combined with a housing case.

FIG. 10 is a cross-sectional view illustrating a light source module and a display panel module received by a case.

Referring to FIG. 10, the display apparatus 100 may further include a rear case 210, a front case 230 and the bracket 240. The rear case 210 and the front case 230 are an outer housing of the display apparatus 100, when the display apparatus 100 is used.

The rear and front cases 210 and 230 face and combine with each other, and receive the display panel module and the light source module 101. The rear case 210 receives the rear receiving frame 130, and the front case 230 receives the front receiving frame 107.

A bracket 240 is disposed between the bottom plate 132 and the rear case 210. The bracket 240 is combined with the combining portion 138 formed on the bottom plate 132 through the screw. The bracket 240 may be combined with a bottom plate or a sidewall of the rear case 210 through use of the threaded screw shown in the illustration or with use of other fastening means. In this case where a threaded screw is used, a pre-threaded and matching hole may be provided in combining portion 138 as shown. In one embodiment, the bracket 240 is spaced apart from the bottom plate by a predetermined distance by the combining portion 138, and the bracket 240 is mostly spaced apart from the heat-sinking/radiating groove 134 except for a minor contact portion so that outer surface walls of the heat-sinking/radiating groove 134 can convectively dissipate heat energy to surrounding air.

Figure 11:
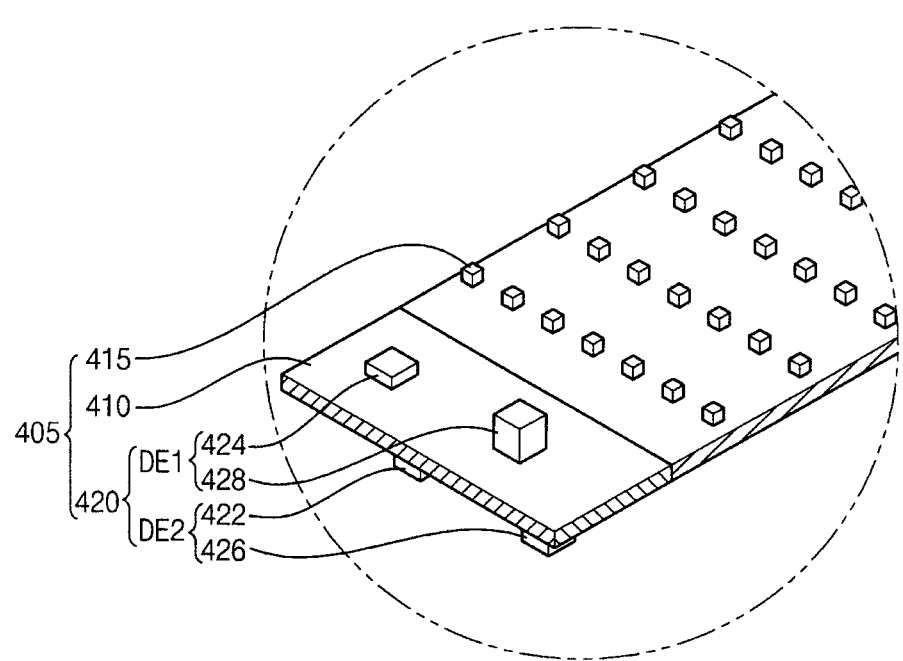
FIG. 11 is a perspective view illustrating a light sources supporting substrate of a light sourcing module according to another example embodiment.

FIG. 11 is a perspective view illustrating a light source substrate of a light source module according to another example embodiment.

Referring to FIG. 11, the light source module according to the present example embodiment is substantially the same as the light source module 101 in FIGS. 1 to 10, except for a position in which the first and second driving elements DE1 and DE2 are disposed.

In the present example embodiment, the light source module may be applied in case that the second driving element DE2 generates the high heat. For example, the second driving element DE2 converts the basic power transmitted from outside into the applied power and outputs the applied power to the first driving element DE1. The second driving element DE2 is disposed at the side end of the lower surface of the double-sided wiring substrate 410. The second driving element DE2 may include first and second converters 422 and 426. The first and second converters 422 and 426 are inserted into the heat-radiating groove formed on the bottom plate of the rear receiving frame, and may make direct contact with an inner surface of the heat-radiating groove or may make contact with the inner surface of the heat-radiating groove through the heat-radiating pad.

The first driving element DE1 converts the applied power into the driving power, and outputs the driving power to the point light sources 415. The first driving element DE1 is mounted on the side end of the upper surface of the double-sided wiring substrate 410. The first driving element DE1 may be electrically connected to the point light sources 115 through the wiring pattern. The first driving element DE1 may include a power controller 424 and a power output part 428.

According to the present disclosure, a light source module may have enhanced heat-sinking and dissipating/radiating efficiency, and the number of discrete components of a display apparatus may be decreased. Thus, a backlight module using a light source substrate on which point light sources are mounted may have the enhanced heat-dissipating/radiating efficiency and the decreased number of components, so that the module may be more simplified.

The foregoing is illustrative of the present teachings and is not to be construed as limiting thereof. Although a few example embodiments have been described, those skilled in the art will readily appreciate from the disclosure that many modifications are possible in the example embodiments without materially departing from the novel teachings and advantages disclosed herein. Accordingly, all such modifications are to be construed as being included within the scope of the present disclosure. In the claims, means-plus-function clauses are intended to cover the structures described herein as performing the recited function and not only structural equivalents but also equivalent structures. Therefore, it is to be understood that the foregoing is illustrative of the present disclosure of invention and is not to be construed as limited to the specific example embodiments disclosed, and that modifications to the disclosed example embodiments, as well as other example embodiments, are intended to be included within the scope of the present teachings.

What is claimed is:

1. A light source module comprising:
a light sources supporting substrate having upper and lower major surfaces facing away from each other, a plurality of light sources disposed on the upper major surface, and one or more first power supplying devices disposed on the lower major surface and electrically coupled to the light sources so as to supply electrical power to the light sources, the one or more first power supplying devices including a first power supplying device;
a receiving frame facing the lower major surface, the receiving frame including a bottom plate having one or more heat-sinking-and-heat-dissipating recesses, the one or more recesses being dimensioned and positioned to receive and thermally couple with the one or more first power supplying devices disposed on and protruding from the lower major surface of the light sources supporting substrate, the one or more recesses including a first recess, the first power supplying device being disposed inside the first recess and providing first electrical power to at least one of the light sources; and
an electrically insulative heat-transfer member disposed inside the first recess and providing thermal coupling between the first power supplying device and an inner surface of the first recess,
wherein the electrically insulative heat-transfer member contacts a base surface of the first recess and contacts the first power supplying device, and
wherein the first power supplying device contacts a side surface of the first recess.

2. The light source module of claim 1, wherein
the base surface of the first recess is dimensioned and positioned to thermally couple with the first power supplying device, and
wherein the side surface of the first recess extends from a region of the bottom plate and is connected to the base surface.

3. The light source module of claim 2, wherein the electrically insulative heat-transfer member provides thermal coupling between the first power supplying device and the base surface of the first recess, and wherein the first power supplying device contacts a plurality of side surfaces of the first recess.

4. A light source module comprising:
a light sources supporting substrate having upper and lower major surfaces facing away from each other, a plurality of light sources disposed on the upper major surface, and one or more first power supplying devices disposed on the lower major surface and electrically coupled to the light sources so as to supply electrical power to the light sources, the one or more first power supplying devices including first power supplying device; and
a receiving frame facing the lower major surface, the receiving frame including a bottom plate having one or more heat-sinking-and-heat dissipating recesses, the one or more recesses being dimensioned and positioned to receive and thermally couple with the one or more first power supplying devices disposed on and protruding from the lower major surface of the light sources supporting substrate, the one or more recesses including a first recess, the first power supplying device being disposed inside the first recess, contacting a metal portion of the first recess, and providing first electrical power to at least one of the light sources;
an electrically insulative heat-transfer member disposed inside the first recess and providing thermal coupling between the first power supplying device and an inner surface of the first recess,
wherein the electrically insulative heat-transfer member contacts a base surface of the first recess and contacts the first power supplying device.

5. The light source module of claim 1, wherein
the one or more power supplying devices disposed on the lower major surface include a first driving element,
the first driving element converts a basic power form transmitted from outside into an applied power form,
the light sources supporting substrate further supports one or more second power supplying devices including a second driving element, and
the second driving element receives the applied power form and outputs driving power currents to the light sources.

6. The light source module of claim 5, wherein the first driving element is disposed at or near a side edge of the light sources supporting substrate and the second driving element is disposed at or near the same side edge but protrudes from the upper major surface of the light sources supporting substrate.

7. The light source module of claim 1, further comprising a first driving element, wherein
the light sources supporting substrate further supports one or more second power supplying devices including a second driving element,
the second driving element converts a basic power form transmitted from outside into an applied power form, and
the first driving element receives the applied power form and outputs driving power currents to the light sources.

8. The light source module of claim 7, wherein the basic power form is an alternating current (AC) voltage or current signal and the second driving element comprises:
a first converter converting the basic power form having the alternating current form into the applied power form where the applied power form includes a direct current signal; and
a second converter converting the applied power.

9. The light source module of claim 8, wherein the first driving element comprises:
a power controller outputting a light source control signal and a power control signal, the light source control signal being linked with an image signal generated by a display apparatus receiving light from the light source module, the power control signal controlling the applied power based on a feedback signal obtained from the light sources; and
a power output part converting the applied power into the driving power according to the power control signal and outputting the driving power to the light sources.

10. The light source module of claim 7, wherein the first driving element is disposed at a side end of the lower major surface, and the second driving element is disposed at the same side end but on the upper major surface.

11. The light source module of claim 7, wherein the first and second driving elements are disposed at a side end of the lower major surface, and a second heat-sinking-and-dissipating recess into which the second driving element is inserted is integrally formed on the bottom plate.

12. A display apparatus comprising:
a display panel module including a display panel and including a panel driving part applying a panel driving signal to the display panel;
a light sources supporting substrate having an upper major surface facing a rear surface of the display panel, having a lower major surface facing away from the upper major surface, and having a via extending between the upper major surface and the lower major surface;
a wiring pattern extending through the via for providing electrical connection;
a plurality of light sources disposed on the upper major surface so as to project respective lights towards the rear surface of the display panel;
a power supply unit having a first driving element disposed on the lower major surface of the light sources supporting substrate and electrically connected to the wiring pattern for supplying driving power to the point-type light sources; and
a rear receiving frame including a bottom plate having one or more heat-sinking-and-heat dissipating recess integrally formed in the bottom plate, wherein the heat-sinking-and-heat dissipating recess is positioned and dimensioned to receive the first driving element, the rear receiving frame further including a sidewall supporting the display panel;
an electrically insulative heat-transfer member disposed inside the heat-sinking-and-heat dissipating recess and providing thermal coupling between the first driving element and an inner surface of the recess,
wherein the electrically insulative heat-transfer member contacts a base surface of the recess and contacts the first driving element, and
wherein the first driving element contacts a portion of the recess.

13. The display apparatus of claim 12, wherein the light sources supporting substrate further comprises a pliable heat-transfer member disposed inside the heat-sinking-and-dissipating recess, the pliable heat-transfer member being interposed between and making thermal contact with both of the first driving element and an inner surface of the heat-sinking-and-dissipating recess.

14. The display apparatus of claim 12, wherein concavo-convex heat radiating portions are formed on an outer surface of the heat-sinking-and-dissipating recess.

15. The display apparatus of claim 12, wherein the first driving element comprises a converter converting basic power transmitted from outside into applied power, and the power supply unit further comprises a second driving element, the second driving element being disposed on the double-sided wiring substrate, receiving the applied power and outputting driving power to the point light sources.

16. The display apparatus of claim 15, wherein the first driving element is disposed at a side end of the lower surface, and the second driving element is disposed at the side end of the upper surface as a chip.

17. The display apparatus of claim 12, wherein the power supply unit further comprises a second driving element disposed on the double-sided wiring substrate and converting basic power transmitted from outside into applied power, and the first driving element receives the applied power and outputs driving power to the point light sources.

18. The display apparatus of claim 17, wherein the first driving element comprises:
a power controller receiving a light source control signal linked with the panel driving signal from the panel driving part, and outputting a power control signal controlling the applied power; and
a power output part converting the applied power into the driving power according to the power control signal and outputting the driving power to the point light sources.

19. The display apparatus of claim 17, wherein the first driving element is disposed at a side end of the lower surface as including an integrated circuit chip, and the second driving element is disposed at the side end of the upper surface.

20. The display apparatus of claim 19, wherein a plurality of light sources supporting substrates are disposed on the rear receiving frame sequentially along a second direction, and the display apparatus further comprises:
a side frame covering the side end at which the second driving element is disposed;
an optical member supported by the side frame and disposed between the display panel and the light source substrate; and
a front receiving frame exposing a display area of the display panel and receiving the rear receiving frame.

21. The display apparatus of claim 20, further comprising:
a rear case receiving the rear receiving frame;
a front case exposing the display area, receiving the front receiving frame and combined with the rear case; and
a bracket disposed between the rear receiving frame and the rear case and joining the rear receiving frame with the rear case.

22. The display apparatus of claim 21, wherein the rear receiving frame includes a combining portion structured to combine with the bracket through use of a screw that protrudes toward a rear surface of the bottom plate, and a portion of the bracket is spaced apart from the heat-sinking-and-dissipating recess so that the combining portion is disposed between the portion of the bracket and the heat-sinking-and-dissipating recess.

* * * * *